US011121547B2

(12) United States Patent
Kelly et al.

(10) Patent No.: US 11,121,547 B2
(45) Date of Patent: Sep. 14, 2021

(54) DEVICE AND METHOD FOR OVERVOLTAGE PROTECTION

(71) Applicant: Analog Devices International Unlimited Company, Limerick (IE)

(72) Inventors: Alan Kelly, County Kilkenny (IE); David Aherne, Limerick (IE); Aidan J. Cahalane, County Clare (IE)

(73) Assignee: Analog Devices International Unlimited Company, Limerick (IE)

( * ) Notice: Subject to any disclaimer, the term of this patent is extended or adjusted under 35 U.S.C. 154(b) by 233 days.

(21) Appl. No.: 16/372,955

(22) Filed: Apr. 2, 2019

(65) Prior Publication Data

US 2020/0321777 A1    Oct. 8, 2020

(51) Int. Cl.
*H02H 9/04* (2006.01)
*H01L 27/02* (2006.01)

(52) U.S. Cl.
CPC ......... *H02H 9/042* (2013.01); *H01L 27/0248* (2013.01); *H02H 9/043* (2013.01); *H01L 27/02* (2013.01); *H02H 9/04* (2013.01)

(58) Field of Classification Search
CPC .......... H02H 9/04; H02H 9/042; H02H 9/043; H01L 27/02; H01L 27/0248
USPC .................................................. 361/56, 91.1
See application file for complete search history.

(56) References Cited

U.S. PATENT DOCUMENTS

| 4,964,160 | A | 10/1990 | Traube et al. |
| 5,225,958 | A | 7/1993 | Nakamura |
| 5,604,785 | A | 2/1997 | Pryor et al. |
| 5,652,575 | A | 7/1997 | Pryor et al. |
| 5,768,341 | A | 6/1998 | Pryor et al. |
| 7,471,494 | B2 * | 12/2008 | Ausserlechner ..... H03K 17/082 361/90 |

(Continued)

FOREIGN PATENT DOCUMENTS

| CN | 2800617 | 7/2006 |
| EP | 0546963 | 6/1993 |

(Continued)

OTHER PUBLICATIONS

"ADG5348F/ADG5249F: User Defined Fault Protection and Detection, 0.8 pC Q(inj), 8:1 Dual 4:1 Multiplexers", Analog Devices Data Sheet, (2016), 34 pgs.

(Continued)

*Primary Examiner* — Danny Nguyen
(74) *Attorney, Agent, or Firm* — Schwegman Lundberg & Woessner, P.A.

(57) ABSTRACT

The present disclosure provides a method and device for overvoltage protection. Specifically, the present disclosure provides an overvoltage protection device which provides a feedback loop for electronic components such as amplifiers and digital to analog converters which require feedback. The overvoltage protection device also includes overvoltage switches in both the signal and feedback channels, which may be opened by a fault detector in the event of an overvoltage. The device also includes an overvoltage feedback channel coupled between the signal and feedback channels, and which also includes a switch which may be closed in the event of an overvoltage event. As such, the overvoltage device provides a closed loop feedback channel during an overvoltage event.

20 Claims, 12 Drawing Sheets

(56) References Cited

U.S. PATENT DOCUMENTS

| | | | |
|---|---|---|---|
| 2003/0223162 A1* | 12/2003 | Ausserlechner | H03F 1/523 |
| | | | 361/42 |
| 2006/0256590 A1 | 11/2006 | Yang | |
| 2009/0116159 A1* | 5/2009 | Xu | H02M 1/32 |
| | | | 361/91.3 |
| 2011/0148200 A1 | 6/2011 | Burns et al. | |
| 2011/0204956 A1 | 8/2011 | Birk | |
| 2013/0063851 A1* | 3/2013 | Stevens | H02H 3/20 |
| | | | 361/91.1 |
| 2013/0248923 A1 | 9/2013 | Aherne et al. | |
| 2013/0249620 A1 | 9/2013 | Aherne | |
| 2016/0172999 A1 | 6/2016 | Fogg | |
| 2016/0359315 A1* | 12/2016 | Khasnis | H02H 1/0007 |
| 2020/0333814 A1* | 10/2020 | Nandi | H03M 1/785 |

FOREIGN PATENT DOCUMENTS

| | | |
|---|---|---|
| EP | 2110920 | 10/2009 |
| EP | 2537243 | 12/2012 |

OTHER PUBLICATIONS

"ADG5412F/ADG5413F: Fault Protection and Detection, 10 Omega R(on), Quad SPST Switches", Analog Devices Data Sheet, (2017), 28 pgs.

\* cited by examiner

DEVICE AND METHOD FOR OVERVOLTAGE PROTECTION

FIELD OF DISCLOSURE

The present disclosure relates to a device and method for overvoltage protection. In particular, the present disclosure relates to overvoltage protection devices for protecting electronic components in analog systems.

BACKGROUND

Overvoltage protection devices are provided in electronic circuits to protect electronic components from overvoltage events. An overvoltage event is one in which a voltage at the output of a circuit exceeds a predetermined threshold, thereby risking damage to an electronic component. Overvoltage events may be caused by a number of factors. For example, an overvoltage may be caused by miswiring, a lightning strike or when a high power device is switched on or off. Alternatively, connection of a device to an inductive load, which can cause ringing, may also cause an overvoltage event. Generally speaking, an overvoltage protection device may include a fault detector which is arranged to detect when the voltage exceeds a predetermined threshold. It may also include a switch which may be opened during an overvoltage event to prevent the overvoltage passing back into the electronic component. Such an arrangement may be provided in an integrated circuit using a dedicated chip. Alternatively, discrete solutions may utilise clamp diodes to shunt any current generated by an overvoltage to the power supply.

SUMMARY OF THE DISCLOSURE

The present disclosure provides a device and method for overvoltage protection. Specifically, the present disclosure provides an overvoltage protection device which provides a feedback loop for electronic components such as amplifiers and digital to analog converters which require feedback. The overvoltage protection device also includes overvoltage switches in both the signal and feedback channels, which may be opened by a fault detector in the event of an overvoltage.

The device also includes an overvoltage feedback channel coupled between the signal and feedback channels, and which also includes a switch which may be closed in the event of an overvoltage event. As such, the overvoltage device provides a closed loop feedback channel during an overvoltage event.

In a first aspect, the present disclosure provides an overvoltage protection device, for protecting an electronic circuit component, comprising: a primary signal channel, arranged to carry an output signal of the electronic circuit component; an overvoltage detector; an first overvoltage switch, arranged in the primary signal channel; and an overvoltage feedback channel; wherein the device is configured to open the first overvoltage switch when an overvoltage is detected by the overvoltage detector, and to cause the output signal to be carried by the overvoltage feedback channel, back to the circuit electronic component.

In a second aspect, the present disclosure provides a system for protecting an electronic circuit component from an overvoltage event, the system comprising: an overvoltage protection device, as claimed in any preceding claim; an electronic component, coupled to an input of the overvoltage protection device; and an output node, coupled to an output of the overvoltage protection device.

In a third aspect, the present disclosure provides a method for protecting an electronic circuit component, the method comprising: carrying an output signal of an electronic circuit component, using a primary signal channel of an overvoltage protection device; monitoring, using an overvoltage detector, an output of the overvoltage protection device for an overvoltage; and in the event of an overvoltage, opening a first overvoltage switch arranged in the primary signal channel; and causing the output signal to be carried by an overvoltage feedback channel, back to the electronic component.

In a fourth aspect, the present disclosure provides an overvoltage protection device, for use in a system including an electronic component which utilises a feedback loop at its output, wherein the device is configured to carry an output signal of the electronic component, and a feedback signal for the electronic component, and further configured to open the feedback loop when an overvoltage is detected, and to prevent an open loop condition by providing an alternative feedback path for the electronic component.

Further features of the present disclosure are listed in the dependent claims.

BRIEF DESCRIPTION OF THE DRAWINGS

The present disclosure will now be described in more detail, by way of example only, and with reference to the accompanying drawings in which.

DETAILED DESCRIPTION

Overvoltage protection devices are typically positioned between an electronic component and an input or an output, in order to protect the electronic component from overvoltage events occurring at the input or output. An overvoltage protection device may include an overvoltage detector (or fault detector) which is arranged to detect the overvoltage event, as well as a switch, provided in series between the electronic component and the output, which may be opened in the event of an overvoltage event. For components that require feedback, the overvoltage protection device should provide protection to the primary signal channel, and a primary feedback channel. As such, the present disclosure provides overvoltage protection switches in series in the primary signal channel and the primary feedback channel. In use, the overvoltage detector may open both of these switches during an overvoltage event, to protect the electronic component at its output, and also at the feedback input.

Breaking the feedback loop and creating an open loop condition is detrimental to the stability of electronic components such as amplifiers and digital to analog converters. Typically, absent a feedback path, the output of the amplifier would increase to the supply rail and the input has no impact of the output. To prevent this happening, the present disclosure includes an overvoltage feedback channel between the primary signal channel and the primary feedback channel on the electronic component side of the overvoltage switches. The overvoltage feedback channel also includes a switch, which may be closed in the event of an overvoltage. As such, a feedback path is maintained and an open loop condition is prevented during an overvoltage event. Using such an arrangement, the output of the electronic component (for example an amplifier) maintains an appropriate level, until such a time that the overvoltage event passes. At which point, the overvoltage switches may be closed, and the overvoltage feedback channel switch may be open.

Figure 1:
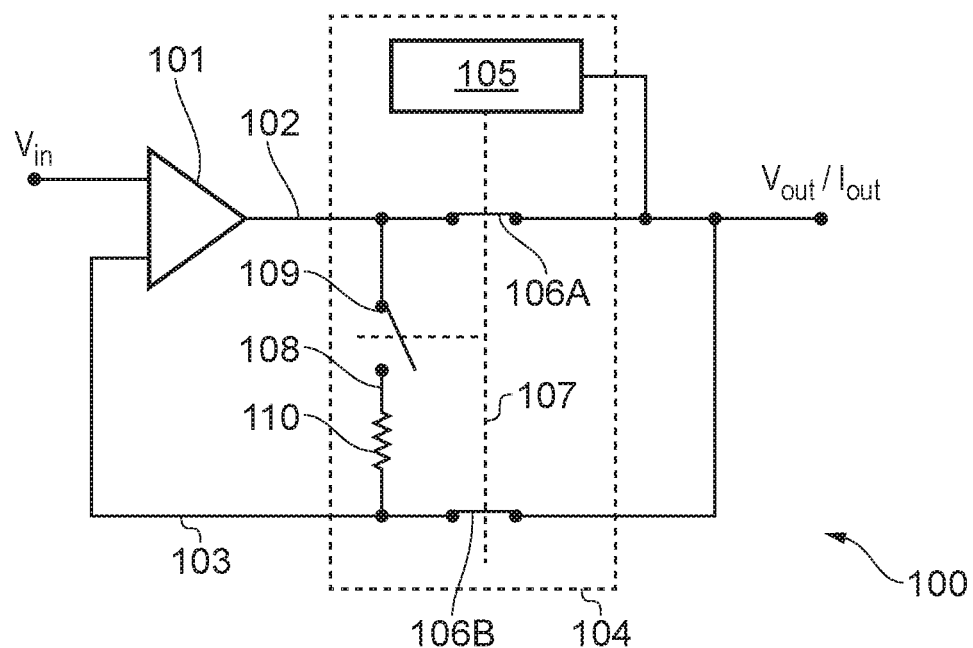
FIG. 1 shows an overvoltage protection device in accordance with an embodiment of the disclosure.

FIG. 1 shows a system 100 which includes an electronic component 101. The electronic component 101 may be an amplifier, a digital to analog converter (DAC), or a current course/sink in a resistance temperature detector (RTD). It will be appreciated that the electronic component 101 may include other types of components which produce an analog output. The electronic component 101 is coupled to a primary signal channel 102 which is arranged to carry an output signal of the electronic component 101. The primary signal channel 102 is coupled to a $V_{out}/I_{out}$ node. The electronic component 101 includes an input port $V_{IN}$.

The system 100 also includes a primary feedback channel 103. The primary feedback channel 103 is coupled between the $V_{out}/I_{out}$ node and a feedback input of electronic component 101. The primary feedback channel effectively runs in parallel to the primary signal channel. The feedback input may for example be a $V_{sense+}$ of a digital to analog converter or an input terminal of an amplifier. As will be familiar to the person skilled in the art, the $V_{sense+}$ inputs are used to provide feedback from the load in order to compensate for any drops in voltage. This closed loop is required during operation in order for stable operation of the system 100.

The system 100 also includes an overvoltage protection device 104. The overvoltage protection device is coupled between an output signal port of the electronic component 101 and the $V_{out}/I_{out}$ node, or downstream component or circuit, in the primary signal channel 102 and the primary feedback channel 103. The overvoltage protection device 104 includes an overvoltage detector 105 which is coupled to the primary signal channel 102 between the overvoltage protection device 104 and the node $V_{out}/I_{out}$. The purpose of the overvoltage detector 105 is to detect an overvoltage event at the $V_{out}/I_{out}$ node and to control the overvoltage protection device 104 accordingly. The overvoltage detector 105 (otherwise known as a fault detector) will be familiar to a person skilled in the art and will not be described in any further detail here. The overvoltage detector 105 is configured to detect a voltage greater than a threshold voltage. The threshold voltage may be the supply voltage, or may be a user defined reference voltage.

Typical supply voltages, and hence threshold voltages, may be ±15V, ±20V, 12V, 36V and 40V. In low voltage systems, the supply voltages may be 5V, 3.3V, 1.8V or 1.2V, all with the negative side to ground. Low voltage systems may also operate at ±2.5V and ±1.8V. In this example, the system may protect an electronic component from overvoltages of up to ±60 volts. However, it will be appreciated that the overvoltage detector 105 may be configured to use different overvoltage thresholds. In the context of this description, an overvoltage event means a voltage which is greater than a predetermined voltage threshold.

The overvoltage protection device 104 includes a first overvoltage switch 106a which is located in series in the primary signal channel 102 between the output of the electronic component 101 and the node $V_{out}/I_{out}$. The overvoltage protection device 104 also includes a second overvoltage switch 106b which is coupled in series in the primary feedback channel 103. Between the electronic component 101 and the $V_{out}/I_{out}$ node. The overvoltage switches 106a, 106b are controlled by the overvoltage detector 105, as indicated by broken line 107. The switches 106a, 106b may be constructed using appropriate combinations of transistors. For example, a switch arrangement such as that shown in US 2013/0248923 A1 may be used.

The overvoltage protection device 104 also includes an overvoltage feedback channel 108. The overvoltage feedback channel 108 is coupled between the primary signal channel 102 and the primary feedback channel 103 between the electronic component 101 and the overvoltage switches 106a, 106b. The purpose of the overvoltage feedback channel is to prevent an open loop condition in the event of an overvoltage event. It does this by providing a feedback channel between the output of the electronic component 101 and its feedback input. The overvoltage feedback channel 108 comprises a first feedback switch 109 which is coupled in series in the overvoltage feedback channel. As such, in effect the first feedback switch 109 is coupled in parallel between the primary signal channel 102 and the primary feedback channel 103. The overvoltage feedback channel 108 also comprises a resistance 110 which represents the resistance of a high resistance MOSFET which may be used as the first feedback switch 109.

Figure 2:
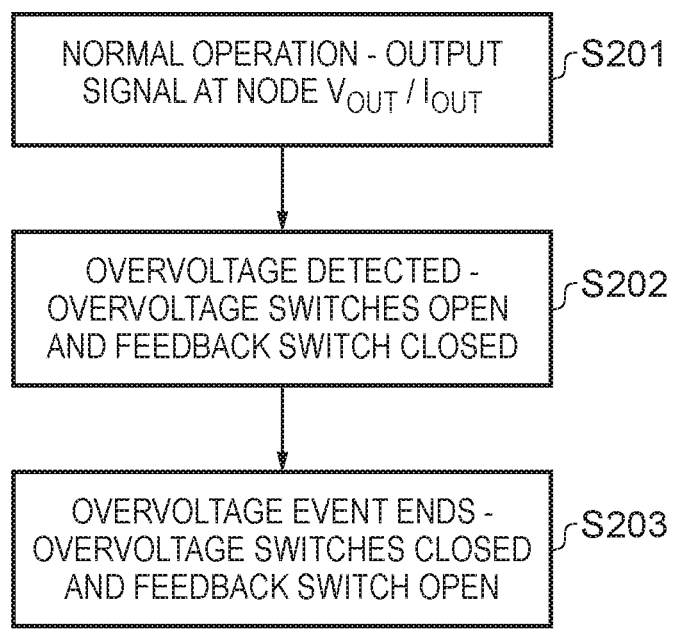
FIG. 2 is a flow chart showing a method of operation of the overvoltage protection device of FIG. 1.
Figure 3:
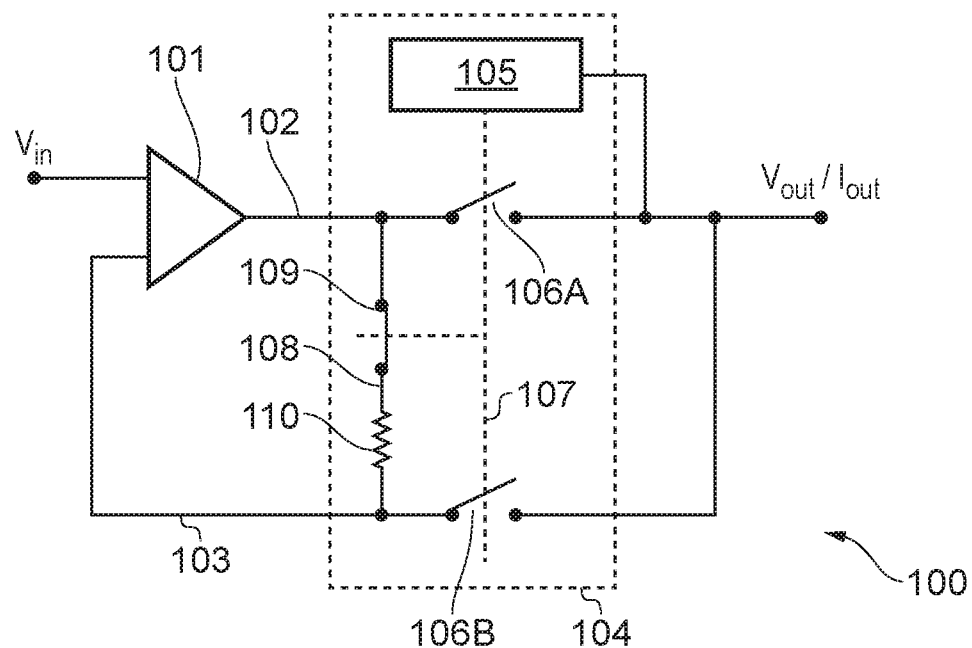
FIG. 3 shows an overvoltage protection device in accordance with a further embodiment of the disclosure.

The operation of the overvoltage protection device 104 will now be described in connection with FIG. 2. During normal operation, the electronic component 101 will receive an input via the node $V_{in}$ and will generate an output along the primary signal channel 102. The overvoltage detection device, under normal operation, will be configured such that switches 106a and 106b are closed, and switch 109 is open. As such, the output of the electronic component 101 will be provided at the node $V_{out}/I_{out}$ with feedback being provided via primary feedback channel 103 to the feedback input of the electronic component 101 (S200). The overvoltage detector 105 monitors the node $V_{out}/I_{out}$ for voltage events up to ±60V, exceeding the predetermined threshold, or supply voltage. In the event that an overvoltage is detected by overvoltage detector 105, the overvoltage detector 105 opens switches 106a, 106b and closes switch 109 (S202). This is shown in FIG. 3. Here it can be seen that the overvoltage detector 105 has instructed switches 106, 106b to open, and switch 109 to close. As such, while the primary feedback loop has now been opened, the output signal is carried by the overvoltage feedback channel 108, thereby maintaining the electronic component 101 in closed loop operation.

The overvoltage detector 105 continues to monitor the voltage at the output node $V_{out}/I_{out}$ and once the overvoltage event has passed, the overvoltage detector 105 instructs the switches 106a, 106b to close, and switch 109 to open (S203). This opens the overvoltage feedback loop but closes the original primary feedback loop and the system 100 continues under normal operation. Alternatively, the user may be required to restart the system. This may be required by some safety critical systems.

There are various advantages to the arrangement shown in FIGS. 1 and 3. Firstly, the electronic component 101 operates in a more stable condition because the feedback loop is maintained during an overvoltage event. As such, when the electronic component 101 is reconnected to the $V_{out}/I_{out}$ output node, the output remains more stable than would be the case without the overvoltage feedback loop. This is described in greater detail below in connection with charts shown in FIGS. 8, 9, 10 and 11.

A further advantage of this arrangement when compared with discrete implementations is that less area is required on the circuit board, and the power dissipation, and hence heat generation, is much lower. For example, a discrete arrangement, which may shunt fault events to the power supply, requires clamp diodes and resistors which when combined with an electronic component such as a digital to analog converter may take up an area of approximately 54 mm². In addition to this, a heat sink taking up around 30 mm² to a height of 4.5 mm may be required. With the present arrangement, the overvoltage protection device 104 may be provided on a signal chip and the combined area with the DAC may be around 42 mm². Furthermore, no heat sink will be required. A traditional discrete implementation may dissipate around 5 to 6 watts, hence the need for a heat sink. The present chip based arrangement dissipates only 3 milliwatts, and hence no heat sink is required.

Figure 4:
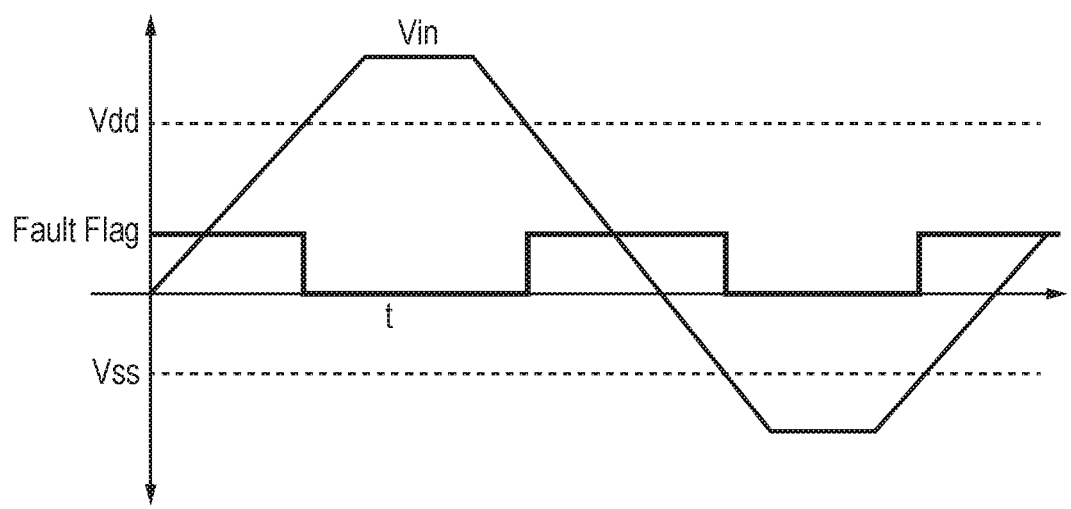
FIG. 4 is a chart showing an output of an overvoltage detector in accordance with an embodiment of the disclosure.

As noted above, the overvoltage protection device 104 may be provided as a signal integrated circuit on a single chip. The overvoltage detector 105 (otherwise known as a fault detector) may also be provided on chip and the chip may include a dedicated fault flag so the user knows when a fault is being detected. As noted above, the fault detector may be readily implemented by a person skilled in the art, and may, for example, be a standard high voltage comparator. The fault detector will compare the input voltage (i.e. the voltage $V_{out}/I_{out}$ output node) to the power supplies. If the input exceeds the power supplies, a fault flag is driven to a logic 0. An example output of the fault detector is shown in FIG. 4. Here it can be seen that whenever the input to the fault detector exceeds the voltage supplies, the fault flag is driven to 0 for the duration of the time for which the input exceeds the power rails. An example of a suitable fault detector, such as a high voltage comparator is described below in connection with FIG. 18.

Figure 5:
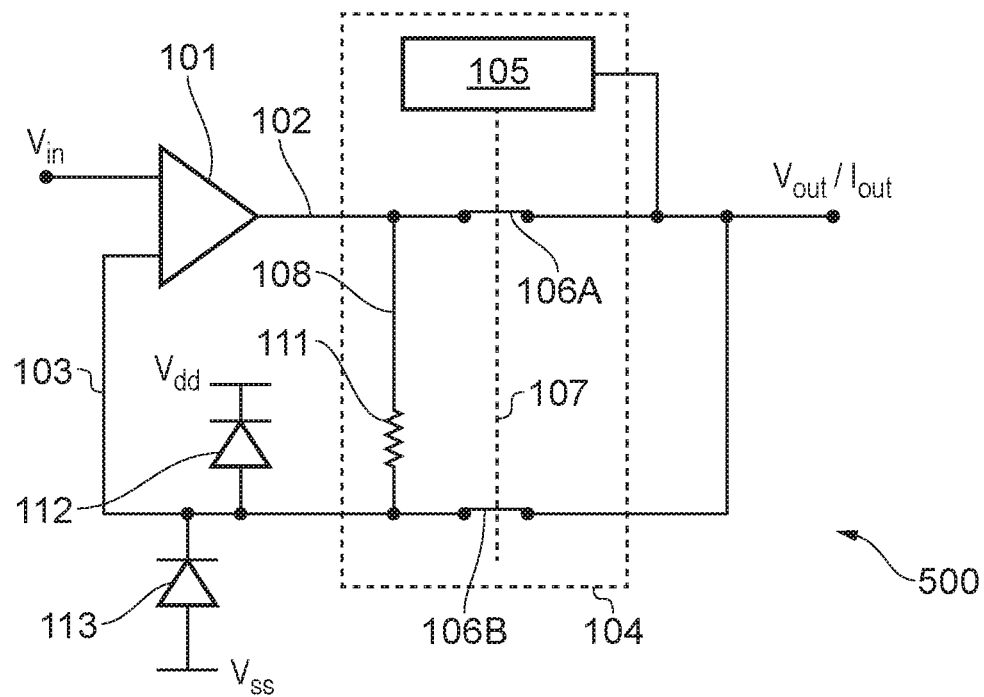
FIG. 5 shows an overvoltage protection device in accordance with a further embodiment of the disclosure.

An alternative embodiment of the present disclosure is shown in FIG. 5. In this example, the circuit is essentially the same as that shown in FIG. 1, however, a high value resistor is used in place of the feedback switch 109. All of the components that are common with FIG. 1 are represented using the same reference numerals as used in FIG. 1. The overvoltage feedback channel 108 includes a high value resistor 111 in place of the first feedback switch 109 and resistance 110. The high value resistor 111 may, for example, be a 100 kΩ resistor. The primary feedback channel 103 is coupled to the voltage rails via diodes 112 and 113. Note that diodes 112 and 113 may form part of the switch 106B, for example if 106B is a MOSFET switch arrangement.

The system 500 operates essentially in the same manner as the system 100, and as such during the overvoltage event the switches 106a, 106b are opened. This causes the electronic component 101 output to be carried by the overvoltage feedback channel 108 and high value resistor 111. During an overvoltage event the diodes clamp the feedback channel to the supply values in order to dissipate power to the supply. While this arrangement provides an alternative to the embodiment shown in FIG. 1, the high value resistor reduces system precision and increases noise. In particular, the resistor 111 will cause an error at $V_{out}$ which may not be removable.

Figure 6:
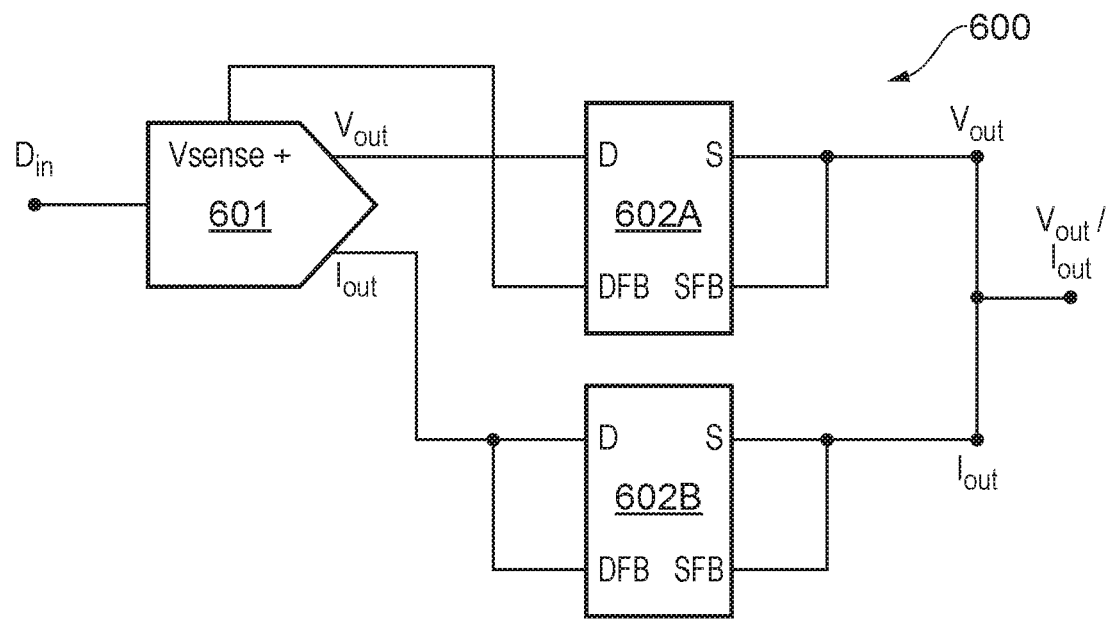
FIG. 6 shows an analog system including two overvoltage protection devices in accordance with an embodiment of the disclosure.

The overvoltage protection device 104 shown in FIG. 1 may be used with a variety of electronic components as suggested above. Furthermore, in certain configurations, two overvoltage protection devices 104 may be used in conjunction with a single electronic component. FIG. 6 shows an arrangement in which the overvoltage protection device is used with a DAC which includes both $V_{out}/I_{out}$ nodes. The system 100 includes a DAC 601 and overvoltage protection devices 602a, 602b. The DAC 601 includes a digital input $D_{in}$, outputs $V_{out}$ and $I_{out}$ and a $V_{sense+}$ feedback port. It will be appreciated that the DAC 601 may include a number of other pins that are omitted here for clarity. Each overvoltage protection device 602a, 602b includes ports D and S for connection to the primary signal channel and ports DFB and SFB for connection to the feedback channel. $V_{out}$ of the DAC 601 is coupled to the port D of overvoltage protection device 602a, $I_{out}$ of the DAC 601 is coupled to the D port of overvoltage protection device 602b. The S ports of each overvoltage protection device are coupled to respective $V_{out}$ and $I_{out}$ nodes which may, optionally, be coupled together to form $V_{out}/I_{out}$ node, depending on the mode of operation. The feedback port of overvoltage protection device 602a is coupled to the $V_{sense+}$ feedback port of the DAC 601 and the feedback port DFB of overvoltage protection device 602b is coupled back to the $I_{out}$ port of the DAC 601.

In this example, $V_{out}$ of the DAC may be an excitation voltage for a sensor or transducer, When operating in $I_{out}$ mode, no feedback is required, so it is tied off to the main channel. $I_{out}$ may, for example, be an excitation current or a 4 mA to 20 mA loop control system. The system 600 may be configured to provide separate $V_{out}$ and $I_{out}$ nodes, or they may be coupled together as shown in FIG. 6. As such, this arrangement provides overvoltage protection in $V_{out}$ and $I_{out}$ modes as well as in a combined mode. The overvoltage protection devices 602a, 602b may include an "IN" port, which enables a user to switch the devices on or off, depending on whether the system is operating in a $V_{out}$, an $I_{out}$, or a combined mode.

Figure 7:
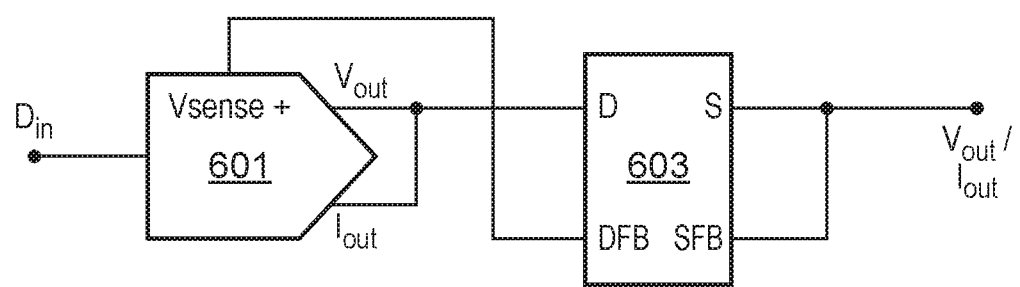
FIG. 7 shows a further analog system including a single overvoltage protection device in accordance with an embodiment of the disclosure.

FIG. 7 shows an alternative arrangement in which a single overvoltage protection device may be used with a DAC which includes $V_{out}$ and $I_{out}$. In this configuration, $V_{out}$ and $I_{out}$ of the DAC are coupled together and also coupled to the D port of overvoltage protection device 603. The DFB port is then coupled back to the $V_{sense+}$ of the DAC 601. As such, this utilises only a single overvoltage protection device for an electronic component which can produce both $V_{out}$ and $I_{out}$.

Figure 8:
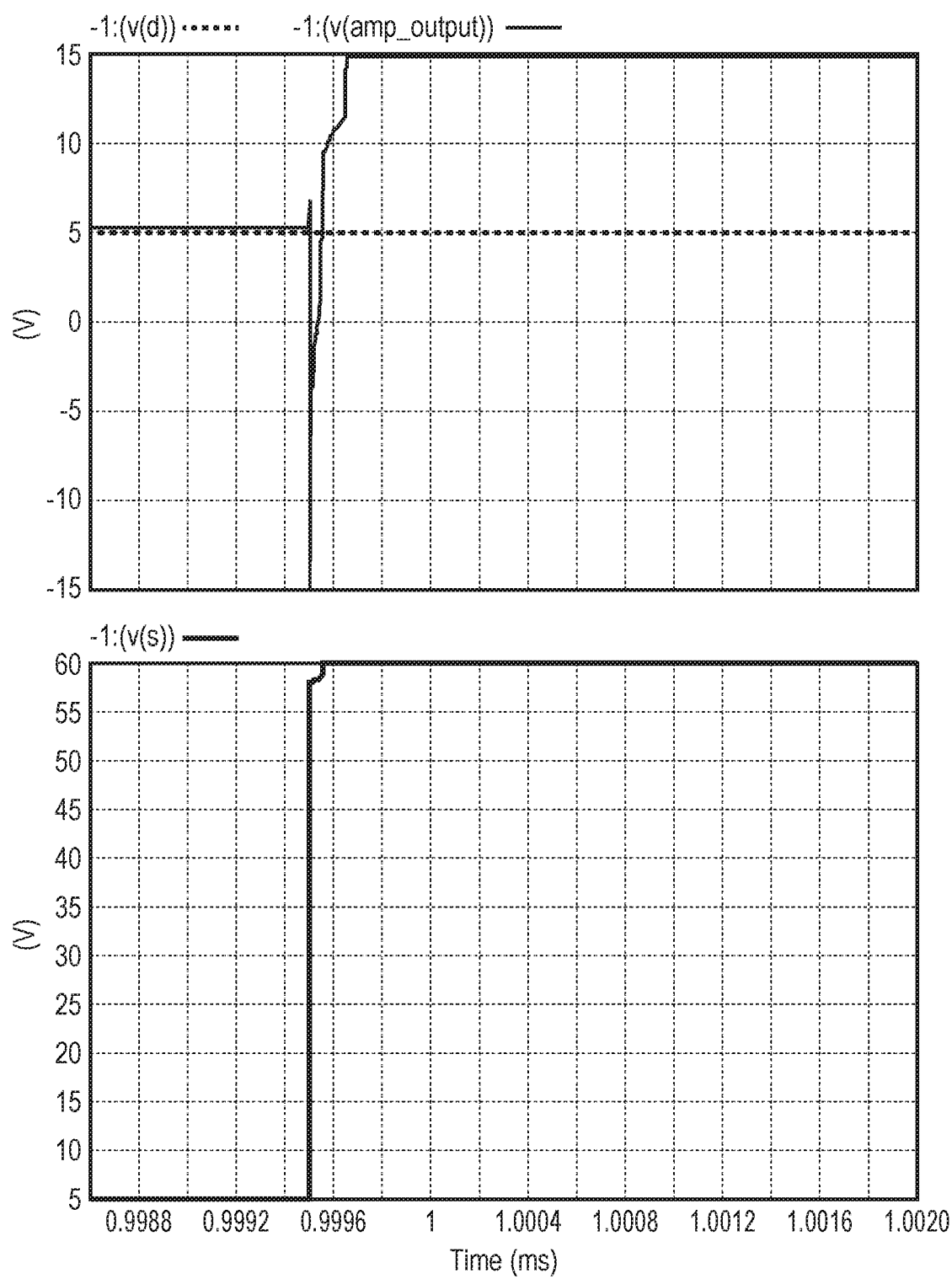
FIG. 8 is a chart showing the output of an electronic component when an overvoltage is detected, using an overvoltage protection device.

The following simulation results show a comparison of how the output voltage performs when overvoltage protection is used with the arrangements shown in FIG. 1, versus an arrangement in which there is no overvoltage feedback channel. FIG. 8 shows two charts showing the application of an overvoltage with overvoltage protection but with no overvoltage feedback channel. As can be seen, when a 60 volt overvoltage is applied to the output, the overvoltage switches are open and the feedback loop is broken. As can be seen in the top chart, the amplifier output increases to the supply rail, and the amplifier input does not change the output voltage.

Figure 9:
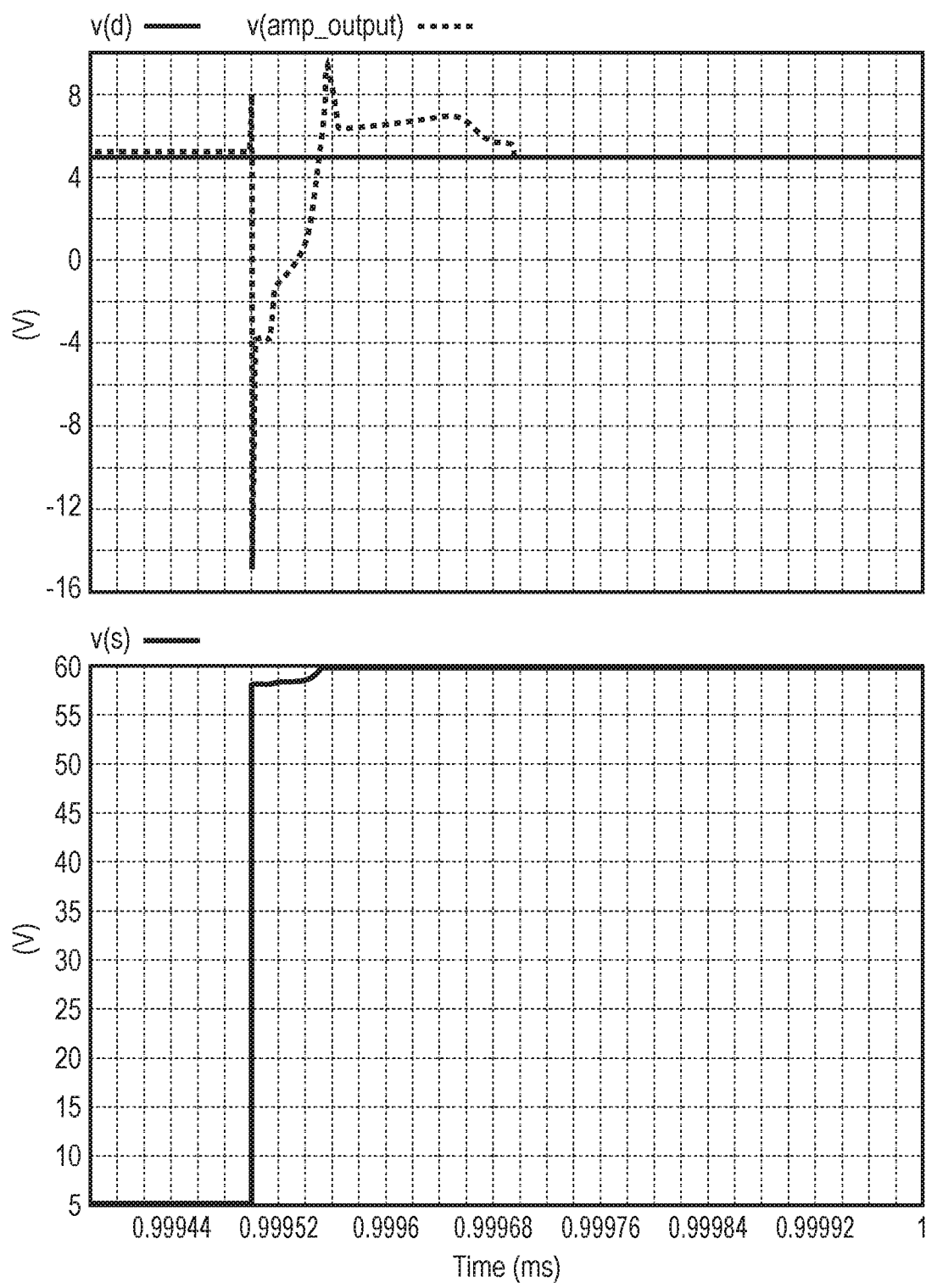
FIG. 9 is a chart showing the output of an electronic component when an overvoltage is detected, when used in conjunction with the overvoltage protection device of FIG. 1.

FIG. 9 shows the application of the same overvoltage but with the arrangement shown in FIG. 1. In this case, the overvoltage switches are open and the feedback switch is closed. The feedback loop is maintained and the amplifier output equals the amplifier input of 5 volts. As such, it can be seen that the use of the overvoltage closed loop channel results in more stable operation of the electronic component.

Figure 10:
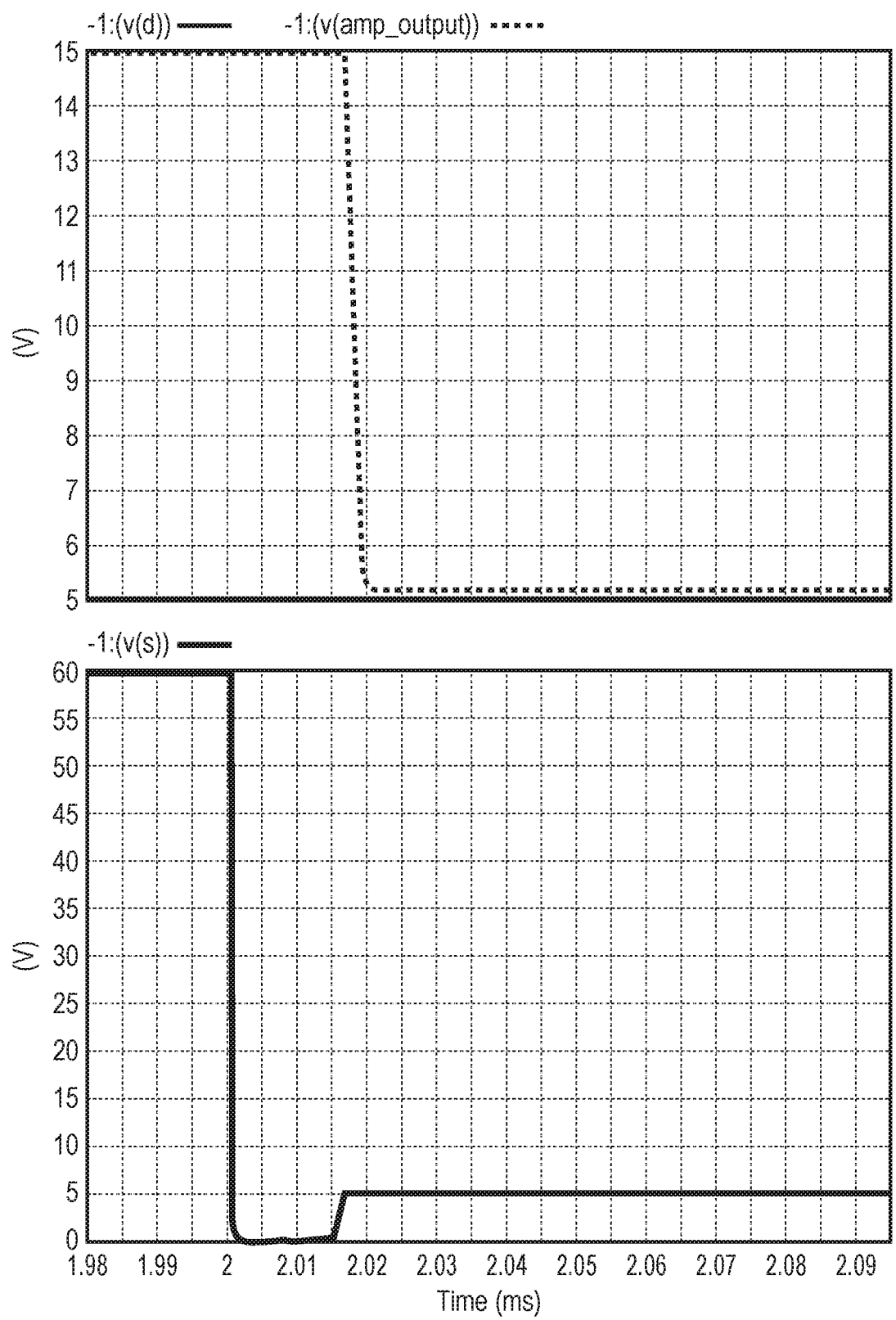
FIG. 10 is a chart showing the output of an electronic component when an overvoltage event ends, using an overvoltage protection device.

FIG. 10 includes two charts which show the characteristics of a system with no open loop protection, when the overvoltage is removed. As can be seen, after a short delay, the voltage at the output returns to 5 volts. The output of the amplifier decrease from the supply to a point just over 5 volts, in order to drive the output of the overvoltage switch to 5 volts.

Figure 11:
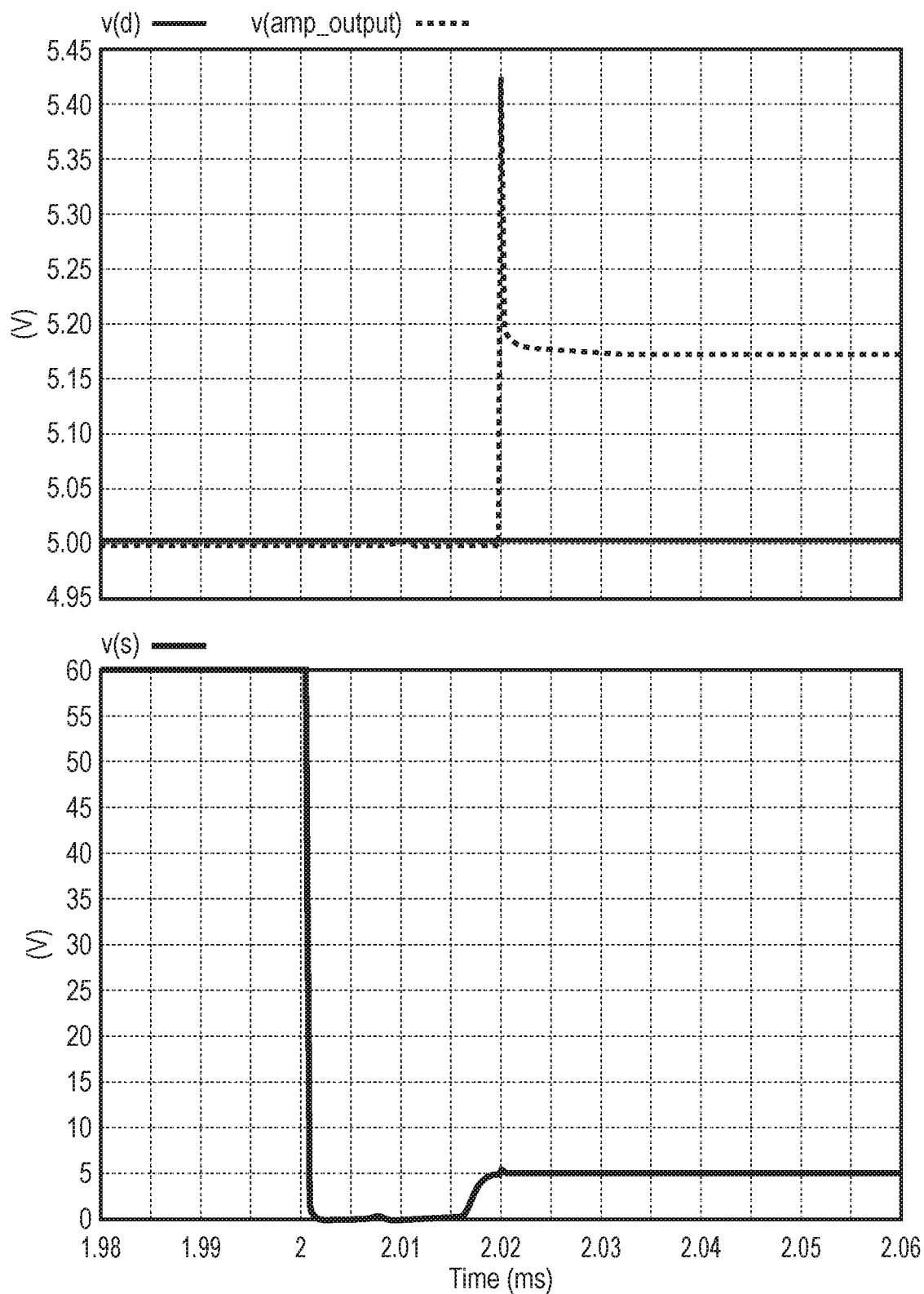
FIG. 11 is a chart showing the output of an electronic component when an overvoltage event ends, when used in conjunction with the overvoltage protection device of FIG. 1.

FIG. 11 shows the same process, but using the device of FIG. 1. Here, the amplifier output increases from 5 volts, driving the output of the protection device to 5 volts.

As noted above, the system of the present disclosure may be used with various electronic components, but is particularly suitable for use with operational amplifier configurations which require feedback. FIG. 1 shows an operational amplifier configured as a voltage follower. FIGS. 12 to 17 show various alternative amplifier configurations which utilise the overvoltage protection device 104 in the primary signal path, and the feedback signal path.

Figure 12:
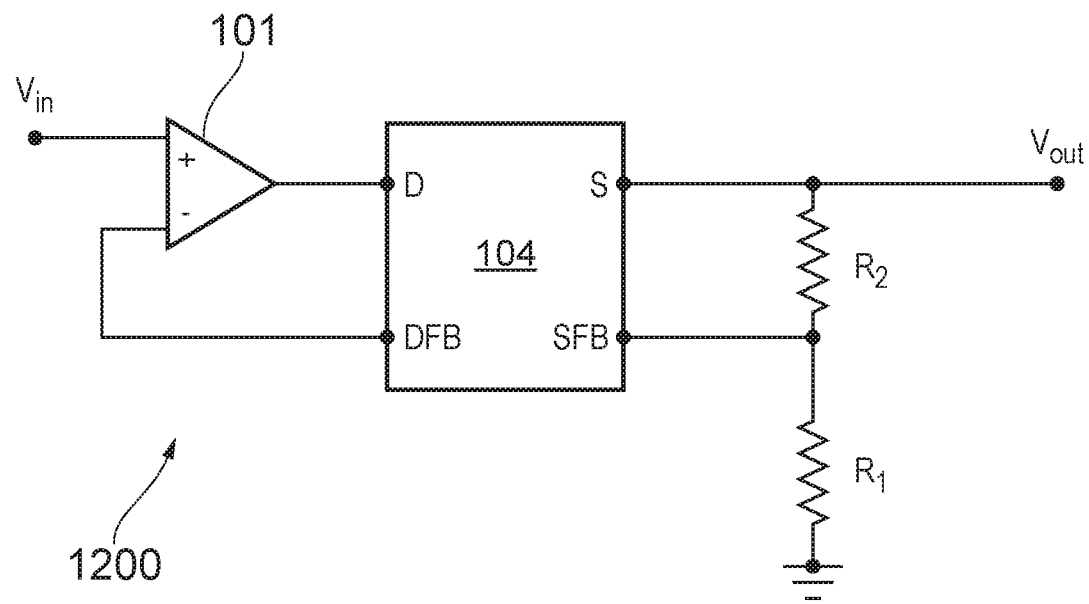
FIG. 12 shows an operational amplifier configured as a non-inverting amplifier in conjunction with the overvoltage protection device of FIG. 1.

FIG. 12 shows a non-inverting amplifier 1200. The amplifier includes an operational amplifier 101 and an overvoltage protection device 104, in a similar manner to that shown in FIG. 1. A feedback resistor $R_2$ is coupled between the SFB and S terminals of the device 104. The SFB terminal is also coupled to ground via resistor $R_1$. As the feedback resistor $R_2$ between the overvoltage switch of device 104 and Vout, the $R_{on}$ of the switch is compensated for. $V_{in}$ is supplied to the non-inverting input of the amplifier 101, and the inverting input is coupled to terminal DFB. During a fault condition, the operational amplifier output is shorted back to the inverting input, which keeps the amplifier stable in a unity gain configuration. The output voltage of the non-inverting amplifier is given by:

$$Vout = Vin * \left(1 + \frac{R2}{R1}\right)$$

Figure 13:
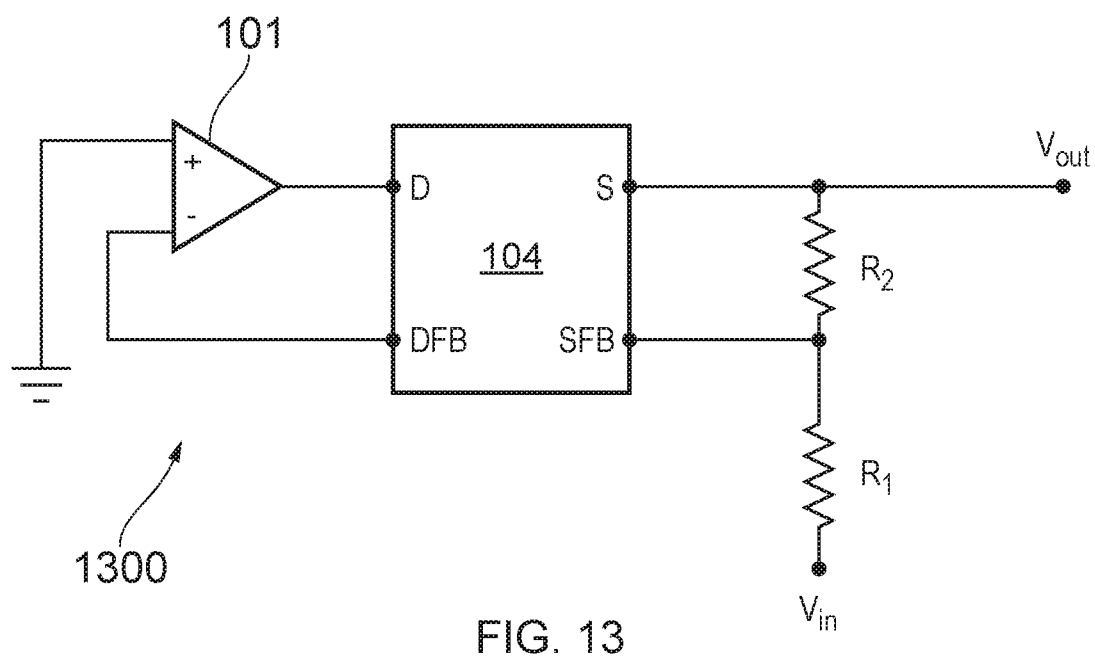
FIG. 13 shows an operational amplifier configured as an inverting amplifier in conjunction with the overvoltage protection device of FIG. 1.

FIG. 13 shows an inverting amplifier 1300. The configuration of this amplifier is the same as for FIG. 12, expect $V_{in}$ and GND are switched around. The output voltage of the inverting amplifier is given by:

$$Vout = -Vin * \left(\frac{R2}{R1}\right)$$

Figure 14:
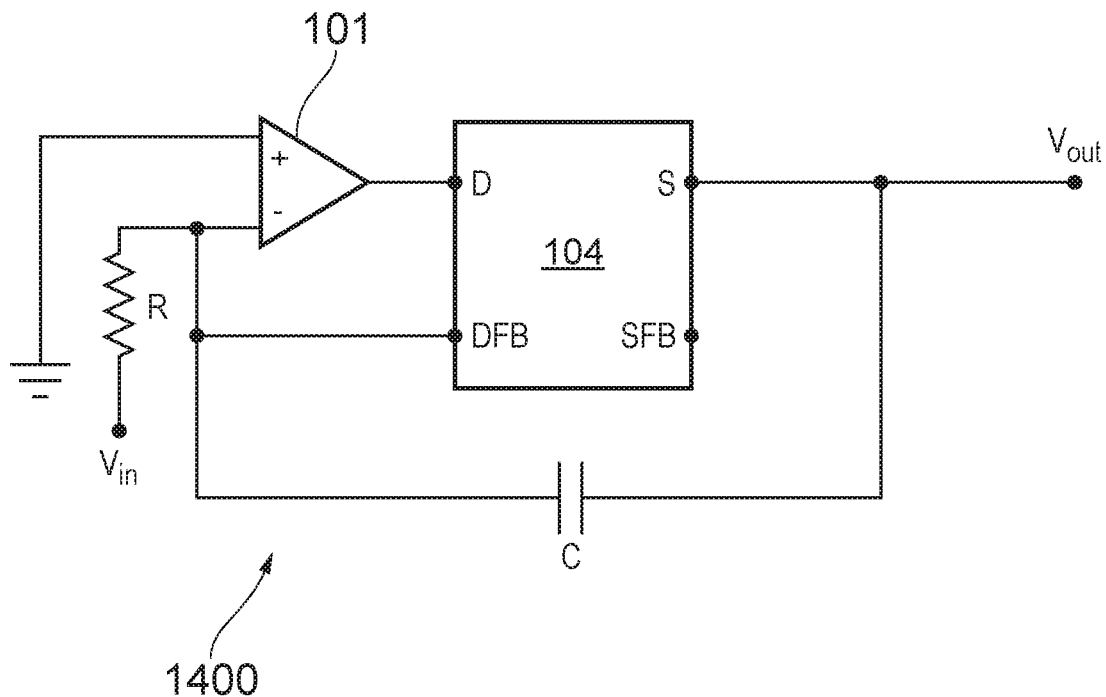
FIG. 14 shows an operational amplifier configured as an integrator amplifier in conjunction with the overvoltage protection device of FIG. 1.

FIG. 14 shows an integrator amplifier 1400. In this example, the feedback path via capacitor C bypasses the overvoltage protection device 104, and is coupled directly to the inverting input of the operational amplifier 101. The input signal $V_{in}$ is provided via resistance R which is coupled to the inverting input. During a fault condition, the output of the operational amplifier 101 is shorted to the inverting input, and the system operates as an inverting amplifier. The voltage rating of the capacitor should be selected to withstand any fault voltage. The output voltage of the integrator amplifier is given by:

$$Vout = -\left(\frac{1}{R*C}\right) Vin.dt$$

Figure 15:
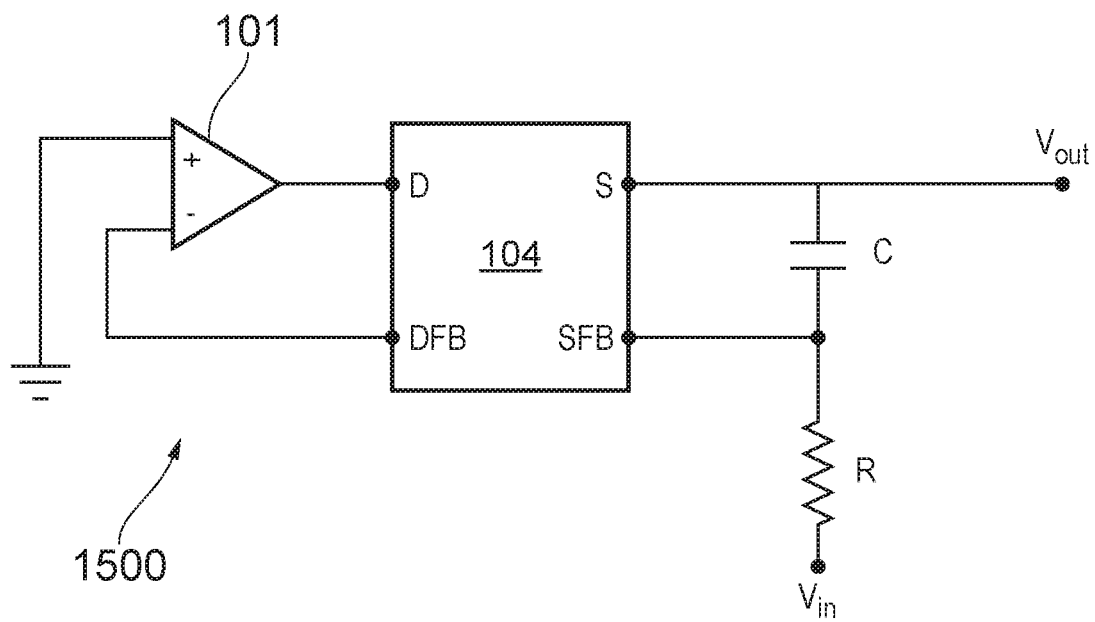
FIG. 15 shows an operational amplifier configured as an integrator amplifier in conjunction with the overvoltage protection device of FIG. 1.

FIG. 15 shows an alternative integrator amplifier 1500. In this example, the capacitor C is coupled between the SFB and S terminals of the overvoltage protection device. The input signal $V_{in}$ is provided via resistance R which is coupled to the SFB terminal. During a fault condition, the output of the operational amplifier 101 is shorted to the inverting input, and the system operates as a buffer amplifier.

Figure 16:
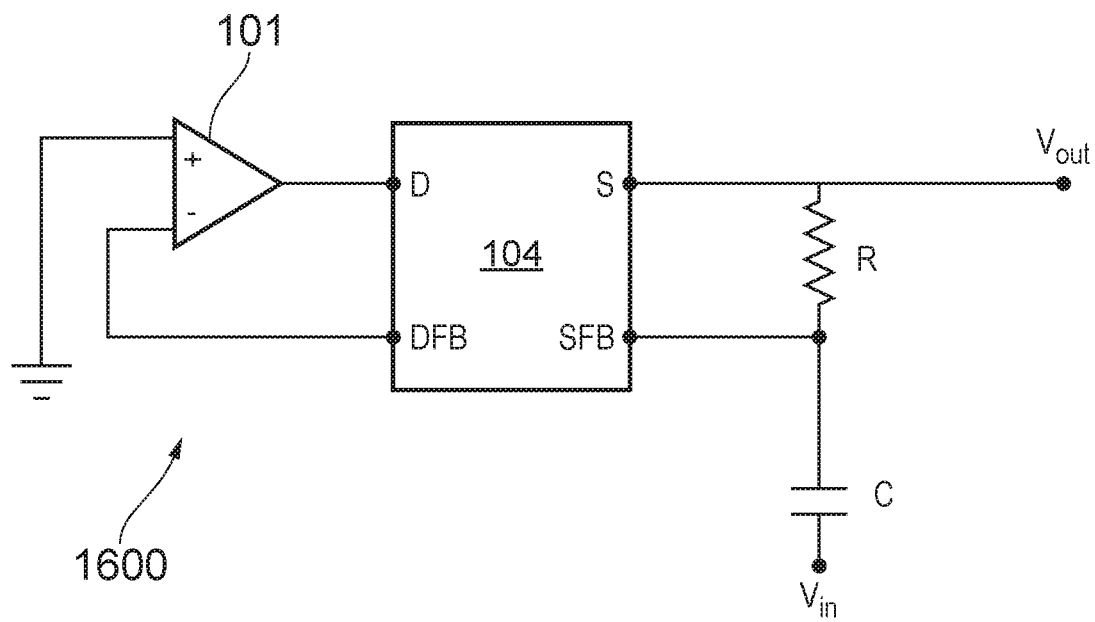
FIG. 16 shows an operational amplifier configured as a differentiator amplifier in conjunction with the overvoltage protection device of FIG. 1.

FIG. 16 shows a differentiator amplifier 1600. The configuration here is the same as for the integrator amplifier 1500, however the R and C components have been switched around. The output voltage of the differentiator amplifier is given by:

$$Vout = -R*C*\left(\frac{dVin}{dt}\right)$$

Figure 17:
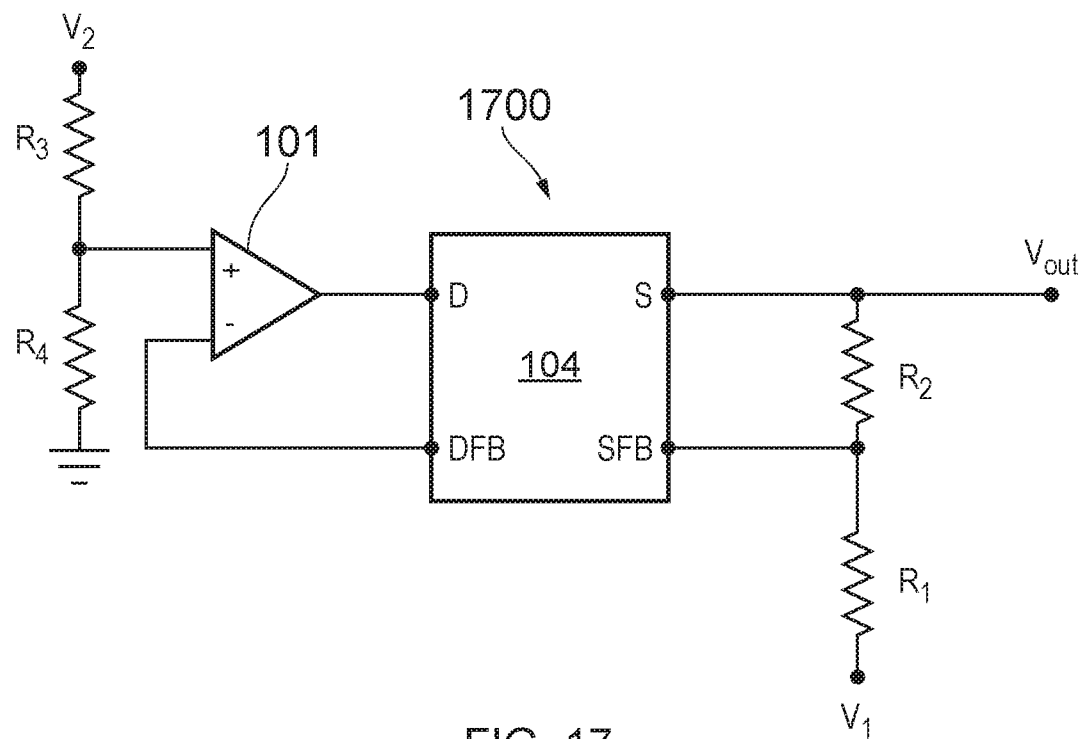
FIG. 17 shows an operational amplifier configured as a differential amplifier in conjunction with the overvoltage protection device of FIG. 1.

FIG. 17 shows a differential amplifier 1700. A first input signal $V_1$ may be supplied via resistor $R_1$, which is coupled to the SFB terminal of the overvoltage protection device 104. A second resistor is coupled between the SFB and S terminals. This input is similar to the input of the inverting amplifier 1300 of FIG. 13. A second input signal $V_2$ may be supplied via resistor $R_3$, which is also coupled to the non-inverting input of the operational amplifier 101. The non-inverting input is also coupled to GND via resistor $R_4$. During a fault condition the amplifier is configured as a buffer amplifier. Assuming that $R_1=R_3$, and $R_2=R_4$, the output voltage of the differential amplifier is:

$$Vout = \left(\frac{R2}{R1}\right) * (V2 - V1)$$

Figure 18:
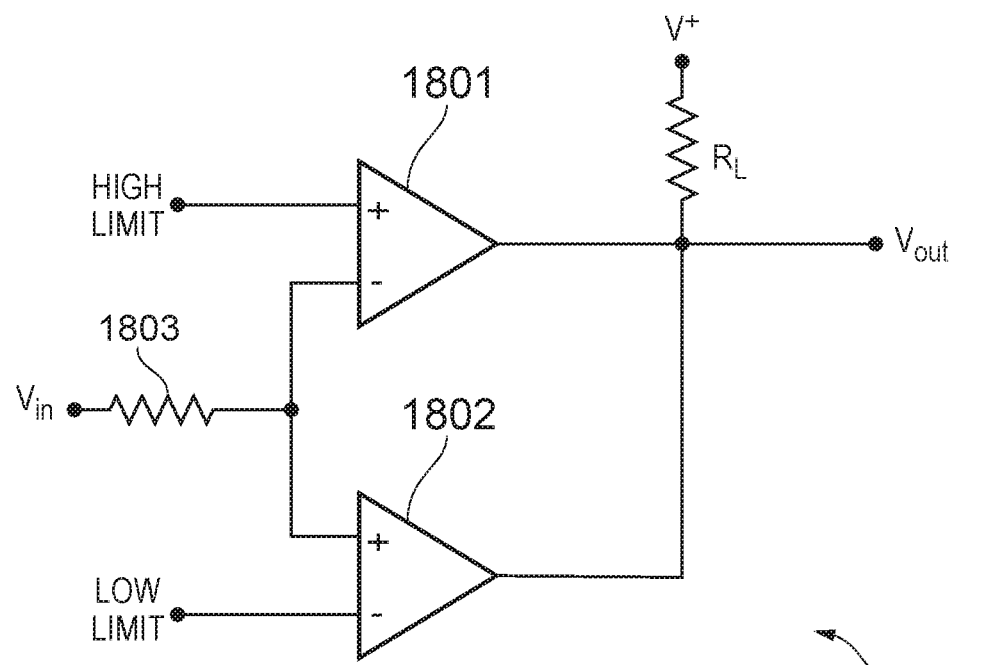
FIG. 18 shows a high voltage comparator which may be used with the overvoltage protection device of FIG. 1.

FIG. 18 shows a high voltage comparator 1800 which may be used as the overvoltage detector 105. The input $V_{in}$ of the comparator 1800 is coupled to $V_{out}/I_{out}$ of the system of FIG. 1, in order to detect overvoltages at the output of the system of FIG. 1. The input $V_{in}$ is coupled to an inverting input of one high voltage comparator 1801 and a non-inverting input of another high voltage comparator 1802, via input resistor 1803. The non-inverting input of comparator 1801 is coupled to a high limit, which may by the positive supply voltage, and the inverting input of comparator 1802 is coupled to a low limit, which may be the negative supply voltage. The outputs of the comparators are coupled together and to $V_{out}$. In use, when the voltage at $V_{in}$ is within the voltage window created by the supplies, the output is high. When the voltage at $V_{in}$ is outside the voltage window, and hence a fault condition has occurred, the output goes low. This output may be used to provide a fault flag and to control the switches of the overvoltage protection device 104. Because the overvoltage protection circuit is configured to detect overvoltages above the supply, a high voltage comparator is required which can detect voltages above the supply. The arrangement shown in FIG. 18 is capable of such operation.

Figure 19:
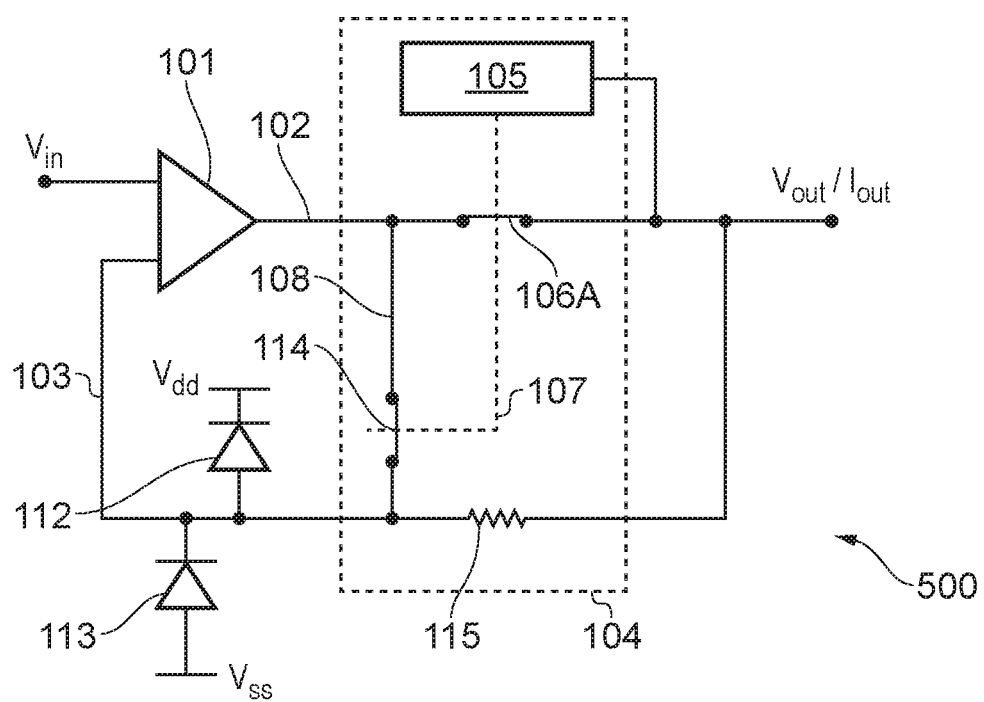
FIG. 19 shows an overvoltage protection device in accordance with a further embodiment of the disclosure.

FIG. 19 is an alternative embodiment to that shown in FIG. 5. In this arrangement, the system configuration is the same as that shown in FIG. 5, expect that the overvoltage feedback channel 108 includes the switch 114, as per switch 109 in FIG. 1, and the primary feedback channel includes a resistor 115 in place of the switch 106B. The operation of the system shown in FIG. 19 is similar to that shown in FIGS. 1 and 5. However, during a fault, and current passing through resistor 115 is passed to the supplies via the clamp diodes.

The overvoltage protection devices of the present disclosure may be used in a number of different applications. As will be appreciated by the skilled person, operational amplifiers have endless applications, and the protection devices described herein may be used in any environment in which an operational amplifier, or other feedback-based component, is susceptible to fault conditions. For example, they may be used in 4 mA to 20 mA systems, such as for protection of Highway Addressable Remote Transducer (HART) modems. They may also be used to protect Source Measurement Units (SMUs). The devices described here may be used with voltage based applications such as voltage drivers for factory automation (for example using Programmable Logic Controllers (PLCs)) and building automation (for example Heating, Ventilation and Air Conditioning (HVAC) systems).

Certain embodiments of the present disclosure will now be described in the following numbered clauses. It will be understood that these clauses may be combined with other embodiments of the disclosure, and with the claims.

1. A system for protecting an electronic component from an overvoltage event, the system comprising:
an electronic component which utilises a feedback loop at its output; and
an overvoltage protection device configured to carry an output signal of the electronic component, and a feedback signal for the electronic component; wherein
the overvoltage protection device is further configured to open the feedback loop when an overvoltage is detected, and to prevent an open loop condition by providing an alternative feedback path for the electronic component.

2. A system according to clause 1, wherein the electronic component is an operational amplifier.

3. A system according to clause 2, wherein the overvoltage protection device comprises a first overvoltage switch in a primary signal channel, between an output of the operational amplifier and an output of the system.

4. A system according to clause 3, wherein the overvoltage protection device further comprises a second overvoltage switch in a feedback signal channel, between the output of the system and an input of the operational amplifier.

5. A system according to clauses 3 or 4, wherein the alternative feedback path is provided by an overvoltage feedback channel having a first feedback switch, configured to close during an overvoltage event.

6. A system according to any preceding clause, wherein the operational amplifier and the overvoltage protection component may be configured such that the system is one of: a non-inverting amplifier, an inverting amplifier, a differential amplifier, an integrator amplifier, or a differentiator amplifier.

7. A system for protecting an electronic component from an overvoltage event, the system comprising:
an electronic component which includes at least two signal outputs; and
at least two overvoltage protection devices, each device configured to protect a different respective signal output from an overvoltage event; wherein
at least one of the overvoltage protection devices provides open loop protection to the electronic component.

8. A system according to clause 7, wherein a first signal output is a voltage output and a second signal output is a current output.

9. A system according to clause 8, wherein the electronic component is a DAC, and feedback is provided to a $V_{sense}$ input of the DAC, wherein the overvoltage protection device providing open loop protection is coupled to the voltage output and the $V_{sense}$ input.

The invention claimed is:

1. An overvoltage protection device, for protecting an electronic circuit component, comprising:
a primary signal channel, arranged to carry an output signal of the electronic circuit component;
a primary feedback channel, configured to maintain a feedback loop, for the electronic circuit component, during normal operation;
an overvoltage detector;
an first overvoltage switch, arranged in the primary signal channel;
a second overvoltage switch, arranged in the primary feedback channel, wherein the device is configured to open the second overvoltage switch when an overvoltage is detected by the overvoltage detector;
an overvoltage feedback channel; and wherein
the device is configured to open the first overvoltage switch when an overvoltage is detected by the overvoltage detector, and to cause the output signal to be carried by the overvoltage feedback channel, back to the electronic circuit component.

2. The device according to claim 1, wherein the overvoltage protection device is configured to maintain a feedback loop, using the overvoltage feedback channel, for the electronic circuit component, in the event of an overvoltage.

3. The device according to claim 1, wherein the overvoltage feedback channel comprises a first feedback switch, and the device is configured to close the first feedback switch when an overvoltage is detected by the overvoltage detector.

4. The device according to claim 1, wherein the primary feedback channel is arranged in parallel with the primary signal channel.

5. The device according to claim 1, wherein the overvoltage feedback channel is coupled between the primary signal channel and the primary feedback channel.

6. The device according to claim 1, wherein the primary signal channel comprises a first port for coupling to an output signal port of the electronic circuit component, and a second port, for coupling to a downstream component or circuit.

7. The device according to claim 1, wherein the primary feedback channel comprises a first port for coupling to a feedback port of the electronic circuit component, and a second port for coupling to a downstream component or circuit.

8. The device according to claim 6, wherein the overvoltage feedback channel is coupled between the first ports and the overvoltage switches of the primary signal and primary feedback channels.

9. The device according to claim 1, wherein the overvoltage protection device configured to detect an overvoltage at an output of the primary signal channel.

10. The device according to claim 3, wherein the overvoltage feedback channel further comprises a resistor, in series with the first feedback switch.

11. The device according to claim 1, wherein the first and second overvoltage switches are arranged in series in their respective channels.

12. The device according to claim 1, wherein the device is an integrated circuit.

13. The device according to claim 1, wherein an overvoltage is a voltage above a predetermined threshold, which is a power supply voltage or a reference voltage.

14. The device of claim 1 in a system for protecting an electronic circuit component from an overvoltage event, the system further comprising:
   an electronic component, coupled to an input of the overvoltage protection device; and
   an output node, coupled to an output of the overvoltage protection device.

15. The device according to claim 14, wherein the electronic component is an amplifier, digital-to-analog converter (DAC) or a current source/sink.

16. The device according to claim 15, wherein the overvoltage protection device causes the output signal to be fed back to an amplifier input port or DAC vsense port.

17. A method for protecting an electronic circuit component, the method comprising:
   carrying an output signal of an electronic circuit component, based on an input signal at a first input node to the electronic circuit component, from a protected output node of the electronic circuit component to a system output node, using a primary signal channel of an overvoltage protection device;
   monitoring, using an overvoltage detector, the system output node of the overvoltage protection device for an overvoltage; and
   in the event of an overvoltage, opening a first overvoltage switch arranged in the primary signal channel and causing the output signal to be carried by an overvoltage feedback channel from the protected output node of the electronic circuit component to maintain closed-loop feedback, back to a second input of the electronic component.

18. An overvoltage protection device, for protecting an electronic circuit component, comprising:
   a primary signal channel, arranged to carry an output signal from a protected output node of the electronic circuit component to a system output node subject to overvoltage. wherein the output signal is based upon an input signal at a first input of the electronic circuit component;
   an overvoltage detector, arranged to detect an overvoltage at the system output node;
   an first overvoltage switch, arranged in the primary signal channel between the protected output node of the electronic circuit component and the system output node; and
   an overvoltage feedback channel configured such that, in response to the overvoltage detector detecting the overvoltage at the system output node, the first overvoltage switch is opened to isolate the protected output node of the electronic circuit from the system output node and the output signal from the protected output node of the electronic circuit component is carried by the overvoltage feedback channel to a second input of the electronic circuit component to maintain closed-loop feedback from the protected output node of the electronic circuit component to the second input to the electronic circuit component.

19. The device of claim 18, comprising a primary feedback channel, configured to maintain a feedback loop, for the electronic component, during normal operation.

20. The method of claim 17, further comprising providing a primary feedback channel, configured to maintain a feedback loop, for the electronic component, during normal operation.

* * * * *